(12) United States Patent
Hossain et al.

(10) Patent No.: US 12,224,240 B2
(45) Date of Patent: Feb. 11, 2025

(54) MICROELECTRONIC DEVICES INCLUDING ACTIVE CONTACTS AND SUPPORT CONTACTS, AND RELATED ELECTRONIC SYSTEMS AND METHODS

(71) Applicant: Micron Technology, Inc., Boise, ID (US)

(72) Inventors: S M Istiaque Hossain, Boise, ID (US);
Indra V. Chary, Boise, ID (US);
Anilkumar Chandolu, Boise, ID (US);
Sidhartha Gupta, Boise, ID (US);
Shuangqiang Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 498 days.

(21) Appl. No.: 17/396,939

(22) Filed: Aug. 9, 2021

(65) Prior Publication Data
US 2023/0045353 A1 Feb. 9, 2023

(51) Int. Cl.
*H01L 23/528* (2006.01)
*H01L 21/768* (2006.01)
*H01L 23/522* (2006.01)
*H01L 23/532* (2006.01)
*H10B 41/20* (2023.01)
*H10B 41/35* (2023.01)
*H10B 43/20* (2023.01)
*H10B 43/35* (2023.01)

(52) U.S. Cl.
CPC .... *H01L 23/5283* (2013.01); *H01L 21/76816* (2013.01); *H01L 21/76831* (2013.01); *H01L 21/76832* (2013.01); *H01L 21/76877* (2013.01); *H01L 23/5226* (2013.01); *H01L 23/53266* (2013.01); *H10B 41/20* (2023.02); *H10B 41/35* (2023.02); *H10B 43/20* (2023.02); *H10B 43/35* (2023.02)

(58) Field of Classification Search
CPC ........ H10B 43/35; H10B 43/20; H10B 41/35; H10B 41/20; H01L 23/5226; H01L 23/5283; H01L 21/76877; H01L 21/76816; H01L 21/76831; H01L 21/76832
See application file for complete search history.

(56) References Cited

U.S. PATENT DOCUMENTS

| 9,419,135 | B2 | 8/2016 | Baenninger et al. |
| 9,548,316 | B2 * | 1/2017 | Lim ...................... H10B 43/27 |
| 11,056,503 | B2 * | 7/2021 | Kim .................... H01L 23/5226 |
| 11,296,021 | B2 * | 4/2022 | Lee ......................... H10B 41/41 |
| 11,895,838 | B2 * | 2/2024 | Baek ...................... H10B 41/10 |

(Continued)

*Primary Examiner* — Jaehwan Oh
*Assistant Examiner* — John M Parker
(74) *Attorney, Agent, or Firm* — TraskBritt

(57) ABSTRACT

A microelectronic device, including a stack structure including alternating conductive structures and dielectric structures is disclosed. Memory pillars extend through the stack structure. Contacts are laterally adjacent to the memory pillars and extending through the stack structure. The contacts including active contacts and support contacts. The active contacts including a liner and a conductive material. The support contacts including the liner and a dielectric material. The conductive material of the active contacts is in electrical communication with the memory pillars. Methods and electronic systems are also disclosed.

25 Claims, 11 Drawing Sheets

(56) References Cited

U.S. PATENT DOCUMENTS

2009/0146206 A1* 6/2009 Fukuzumi ............. H10B 43/20
                                                         257/E21.442
2021/0375938 A1* 12/2021 Lin ..................... H10B 51/30
2021/0408047 A1* 12/2021 Wang ............... H01L 29/41775

* cited by examiner

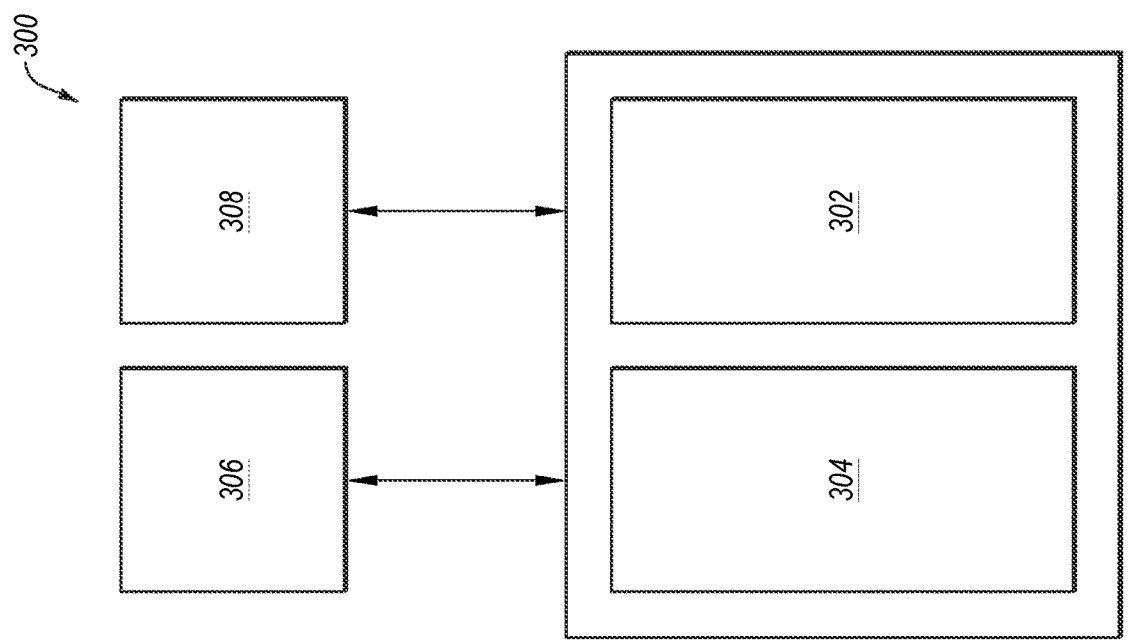

MICROELECTRONIC DEVICES INCLUDING ACTIVE CONTACTS AND SUPPORT CONTACTS, AND RELATED ELECTRONIC SYSTEMS AND METHODS

TECHNICAL FIELD

The disclosure, in various embodiments, relates generally to the field of microelectronic device design and fabrication. More specifically, the disclosure relates to microelectronic devices including support contacts and active contacts, and to related electronic systems, and methods.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s)) of the memory device and access lines (e.g., word lines) so that the memory cells of the vertical memory array can be uniquely selected for writing, reading, or erasing operations.

As the memory density has increased, the number of tiers of conductive structures and dielectric materials and associated memory cells of each vertical memory string has increased. Support contact structures may extend through the stack structure to support the stack structure during various subsequent processing acts (e.g., during a so-called "replacement gate" or "gate last" process). The support contact structures may include various materials (e.g., tungsten) exhibiting a relatively greater tensile stress compared to other materials or structures of the stack structure. As a consequence, tensile stress of the support contact structures acting on the other materials may lead to so-called "block bending" wherein the stack structure incorporating the support contact structures exhibits asymmetries relative to desired dimensions and orientations of features of the stack structure, leading to complications such as tier shrinkage, over etching or under etching of various regions of the stack structure, contact misalignment (e.g., between access lines and the strings of memory cells), and electrical shorting between various conductive features of the stack structure. The high tensile stress of the support contact structures may also lead to pillar bending.

BRIEF DESCRIPTION OF THE DRAWINGS

FIG. 3 is a processor-based system, in accordance with embodiments of the disclosure.

DETAILED DESCRIPTION

Figure 1A:
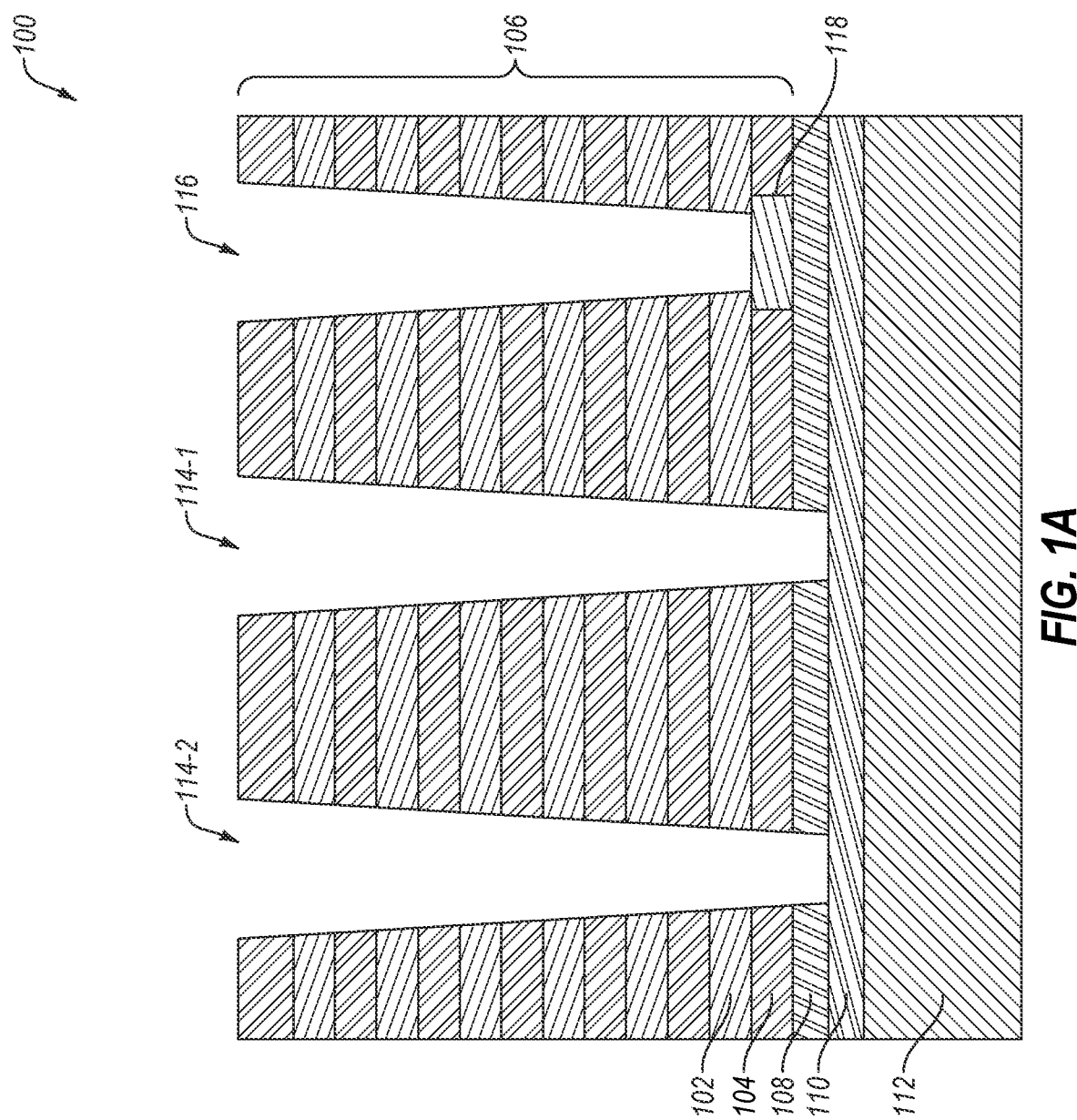
FIGS. 1A-1I are simplified cross-sectional views that illustrate forming a microelectronic device, according to embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as NAND Flash memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes a microelectronic device exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the terms "selectively removable" or "selectively etchable" mean and include a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. The etch selectivity between materials may be achieved by selecting materials of different chemical compositions or by using materials of similar chemical compositions and different dopants or dopant concentrations. Etch chemistries and etch conditions for selectively etching a desired material may be selected by a person of ordinary skill in the art.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIG. 1A is a simplified cross-sectional view of a microelectronic device 100 (e.g., a semiconductor device, a memory device (e.g., a vertical memory device), such as a 3D NAND Flash memory device), at an initial processing stage according to embodiments of the disclosure. The microelectronic device 100 includes a stack structure 106. The stack structure 106 includes alternating materials 102, 104. In some examples, the stack structure 106 includes 8, 16, 32, 64, 128, and/or 256 tiers of alternating materials 102, 104. However, the disclosure is not so limited, and the stack structure 106 may contain any number of alternating materials 102, 104, including greater than 256 or fewer than eight materials.

The alternating materials 102, 104 may include alternating dielectric materials. The dielectric materials may, for example, be one or more of $SiO_x$, phosphosilicate glass (PSG), borosilicate glass (BSG), borophosphosilicate glass (BPSG), fluorosilicate glass (FSG), $AlO_x$, $HfO_x$, $NbO_x$, $TiO_x$, $ZrO_x$, $TaO_x$, and $MgO_x$, at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. The alternating dielectric materials may be selectively etchable relative to one another, to enable removal of one of the dielectric materials (e.g., alternating dielectric material 102) during a subsequently conducted replacement gate process. In some embodiments, the alternating materials 102, 104 are silicon nitride (e.g., $SiN_y$) and silicon oxide (e.g., $SiO_2$).

The stack structure 106 is formed adjacent to (e.g., on) a conductive material 108. The conductive material 108 includes at least one electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive material 108 includes polysilicon.

The conductive material 108 is formed on a conductive base 110. The conductive base 110 may be formed of and includes at least one electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive base 110 includes $WSi_x$. The conductive base 110 is formed on a substrate 112 (e.g., a base material). In some embodiments, the substrate 112 is a bulk substrate.

One or more openings may be formed through the stack structure 106. The openings may include contact openings 114 and slit 116. The contact openings 114 and the slit 116 may be formed by conventional techniques that remove portions of the alternating materials 102, 104 in desired locations. The contact openings 114 may extend from an upper surface of the stack structure 106 to an upper surface of the conductive material 108. The contact openings 114 may become support contacts (e.g., inactive contacts) or active contacts of the microelectronic device 100. As described below, a conductive material may be formed in the first contact openings 114-1 during a subsequently-conducted process act to form the active contacts and one or more dielectric materials may be formed in second contact openings 114-2 during a subsequently-conducted process act to form the support contacts. The contact openings 114-1, 114-2 are collectively referred to as contact openings 114. The contact openings 114-1, 114-2 may also be referred to as active contact openings and support contact openings, respectively. The slit 116 may extend from the upper surface of the stack structure 106 to an upper surface of a conductive plug 118. The slit 116 may be used in a subsequently-conducted process act to facilitate removal of one of the alternating dielectric material 102, 104 during the replacement gate operation. The contact openings 114 and the slit 116 may be formed by a single etch process or by multiple etch processes to achieve the process stage shown is FIG. 1A.

By way of non-limiting example, the contact openings 114 and slit 116 may be formed by etching the alternating materials 102, 104, such as by dry etching, e.g., reactive ion etching (RIE). For example, the alternating materials 102, 104 may be removed by exposure to one or more hydrofluorocarbon gases such as one or more of octylfluorocyclobutane ($C_4F_8$), hexafluoro-1,3-butane ($C_4F_6$), carbon tetrafluoride ($CF_4$), difluoromethane ($CH_2F_2$), fluoromethane ($CH_3F$), fluoroform ($CHF_3$), one or more of sulfur hexafluoride ($SF_6$), and nitrogen trifluoride ($NF_3$); and the other insulative structures may be removed by exposure to one or more of tetrafluoropropene ($C_3H_2F_4$), fluoropropene ($C_3H_5F$), hydrogen ($H_2$), fluorine ($F_2$), carbon tetrafluoride ($CF_4$), fluoromethane ($CH_3F$), or another material. However, the disclosure is not so limited and the contact openings 114 may be formed by other methods and/or with different etch gases. As shown in FIG. 1A, the etching may be terminated at the upper surface of the conductive base 110 in the case of the openings and/or the upper surface of the conductive plug 118 in the case of the slit 116.

Figure 1B:
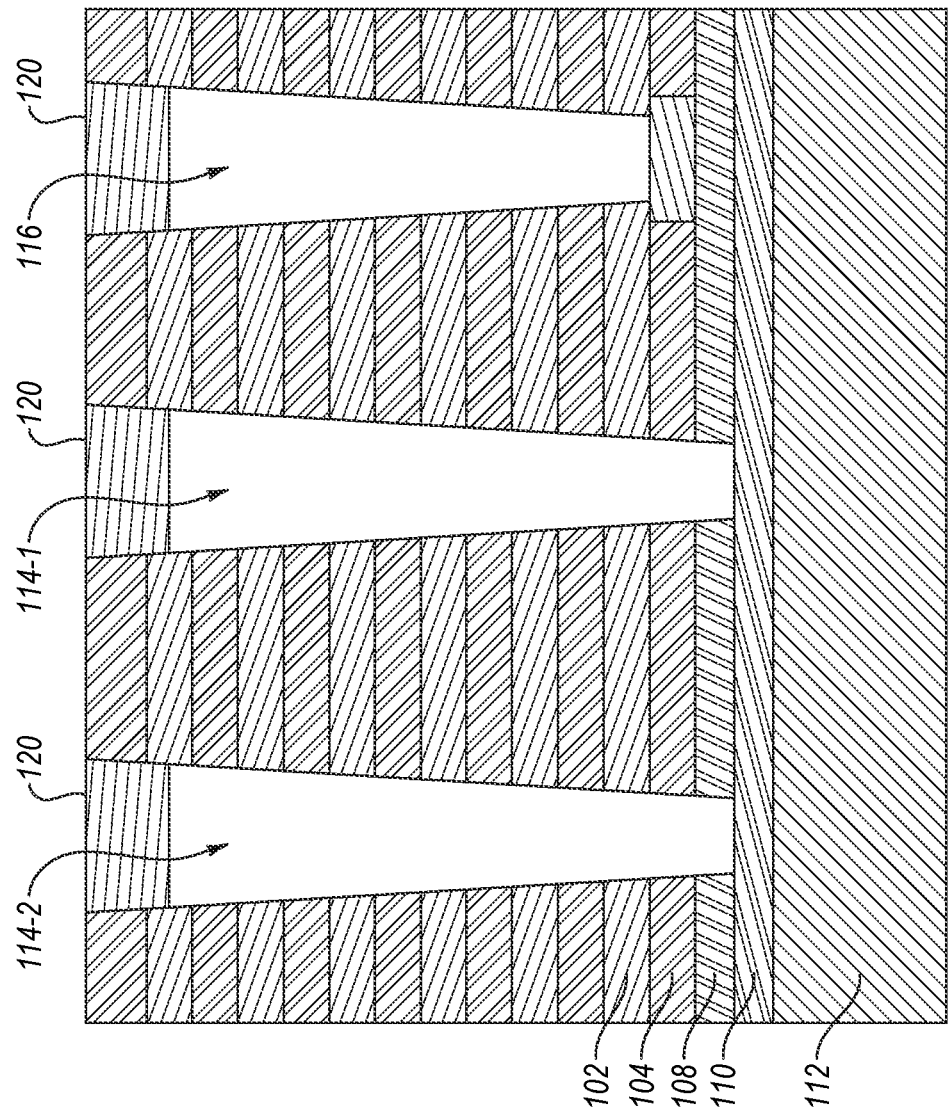

As shown in FIG. 1B, sacrificial structures 120 are formed in the contact openings 114 and the slit 116. The sacrificial structures 120 may be formed by a non-conformal (e.g., sub-conformal) deposition process such that at least a portion of the contact openings 114 and the slit 116 contain the sacrificial structures 120. As shown in FIG. 1B, the sacrificial structures 120 are formed in an upper portion of the contact openings 114 and the slit 116 and partially fill the contact openings 114 and the slit 116. However, the sacrificial structures 120 may substantially completely fill the contact openings 114 and the slit 116. The sacrificial structures 120 may be configured as plugs. A material of the sacrificial structures 120 is selected to be selectively removable (e.g., selectively etchable) compared with other materials when the sacrificial structure 120 is subsequently removed. In some embodiments, the sacrificial structures 120 are formed of aluminum oxide. In other embodiments, the sacrificial structures 120 are formed of carbon.

Figure 1C:
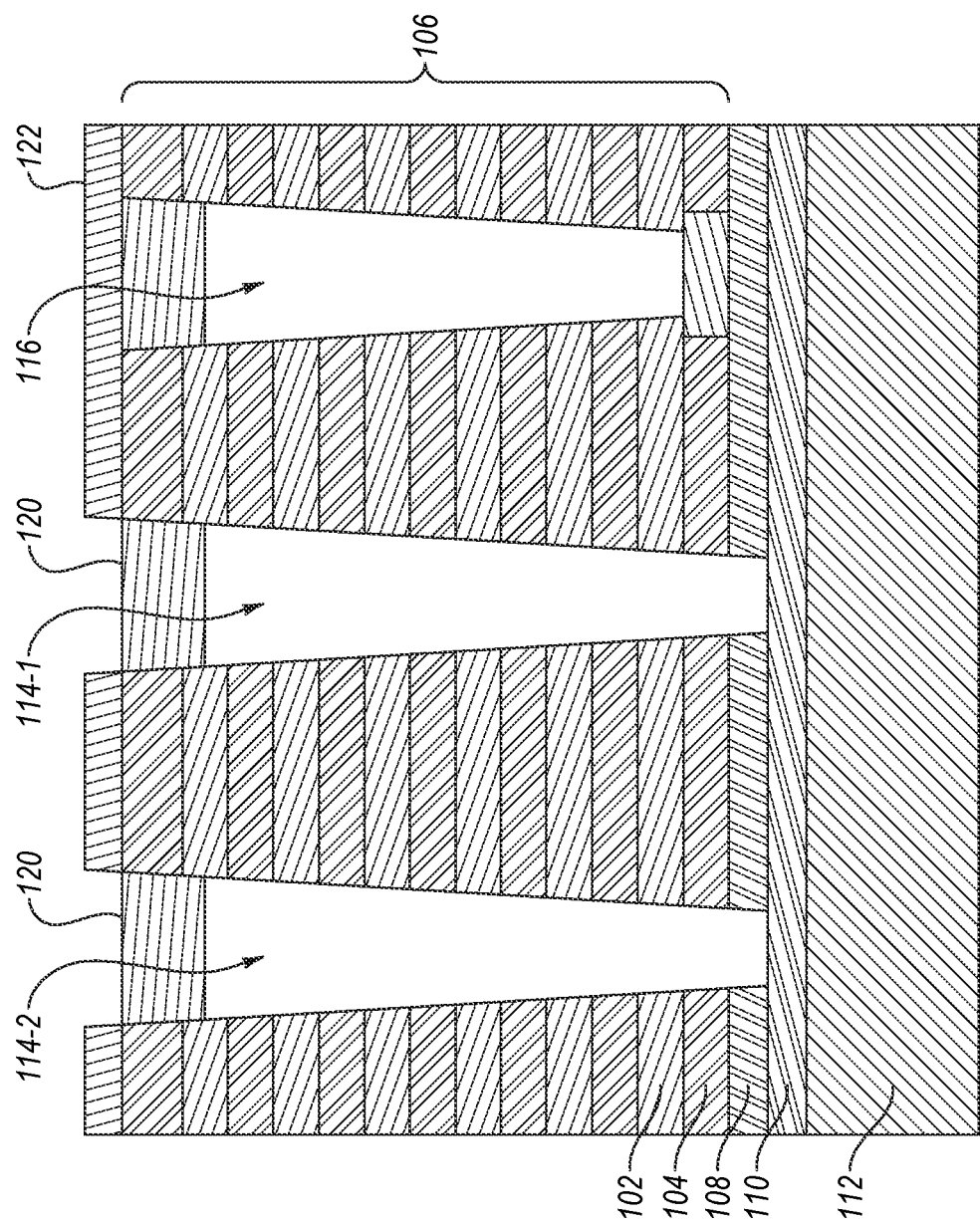

A patterned mask 122 is formed adjacent to (e.g., on) the stack structure 106 and the sacrificial structures 120, as shown in FIG. 1C. A material of the patterned mask 122 may include, but is not limited to, a photoresist material or another dielectric material. The patterned mask 122 may be formed by conventional techniques. The patterned mask 122 includes openings over the contact openings 114, exposing the sacrificial structures 120 in the contact openings 114, while the slit 116 remains covered by the patterned mask 122. The sacrificial structures 120 in the contact openings 114 are then removed, such as by etching the sacrificial structures 120. The sacrificial structures 120 in the contact openings 114 may, for example, be removed by a wet etch process or by a dry etch process. In some embodiments, the removal of the sacrificial structures 120 is accomplished by dry etching the sacrificial structures 120. However, other suitable methods known in the art are also effective at accomplishing this removal. Removing the sacrificial structures 120 exposes sidewalls of the stack structure 106 and the conductive material 108 and an upper surface of the conductive base 110. The sacrificial structures 120 in the slit 116 are not removed since the patterned mask 122 protects the sacrificial structures 120.

Figure 1D:
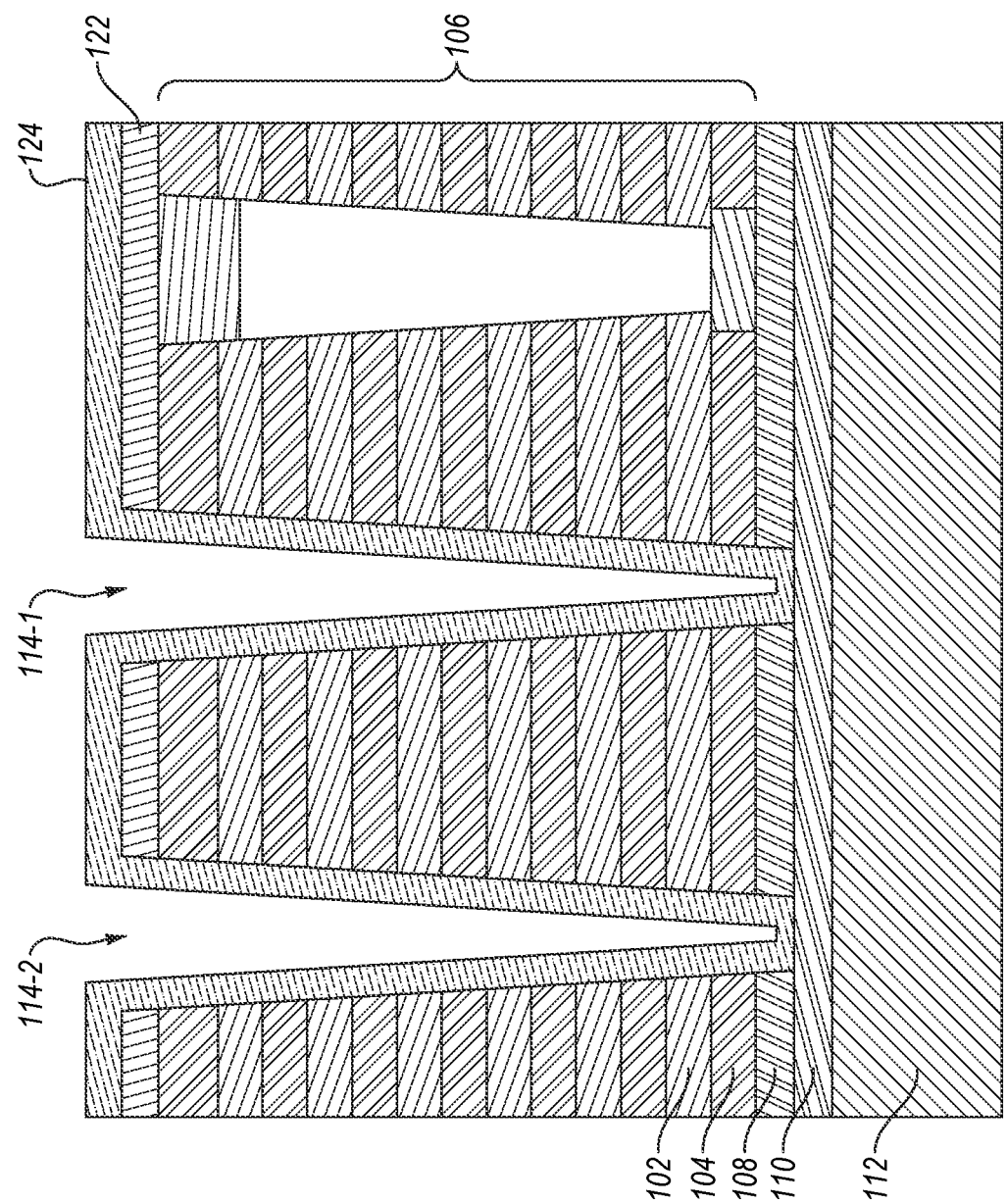

As shown in FIG. 1D, a liner 124 is formed in the contact openings 114, such as on the sidewalls of the stack structure 106 and the conductive material 108 and on the upper surface of the conductive base 110. The liner 124 is also formed over the patterned mask 122. The liner 124 may be formed by a conformal deposition process, such as by PVD. To prevent shorting, the liner 124 may be a dielectric material including, but limited to, an oxide material, e.g., one or more of $SiO_x$, phosphosilicate glass (PSG), borosilicate glass (BSG), borophosphosilicate glass (BPSG), fluorosilicate glass (FSG), $AlO_x$, $HfO_x$, $NbO_x$, $TiO_x$, $ZrO_x$, $TaO_x$, and $MgO_x$. In some embodiments, the liner 124 is formed of silicon oxide (e.g., $SiO_2$). A thickness of the liner 124 may be sufficient to provide mechanical support to the stack structure 106 during subsequent processing acts, such as from about 50 micrometers to about 150 micrometers thick. In addition to providing support, the liner 124 may also function as a barrier between the stack structure 106 and overlying materials. In some embodiments, the liner 124 may be from about 60 micrometers to about 70 micrometers thick. In other embodiments, the liner 124 may be from about 90 micrometers to about 100 micrometers thick.

Figure 1E:
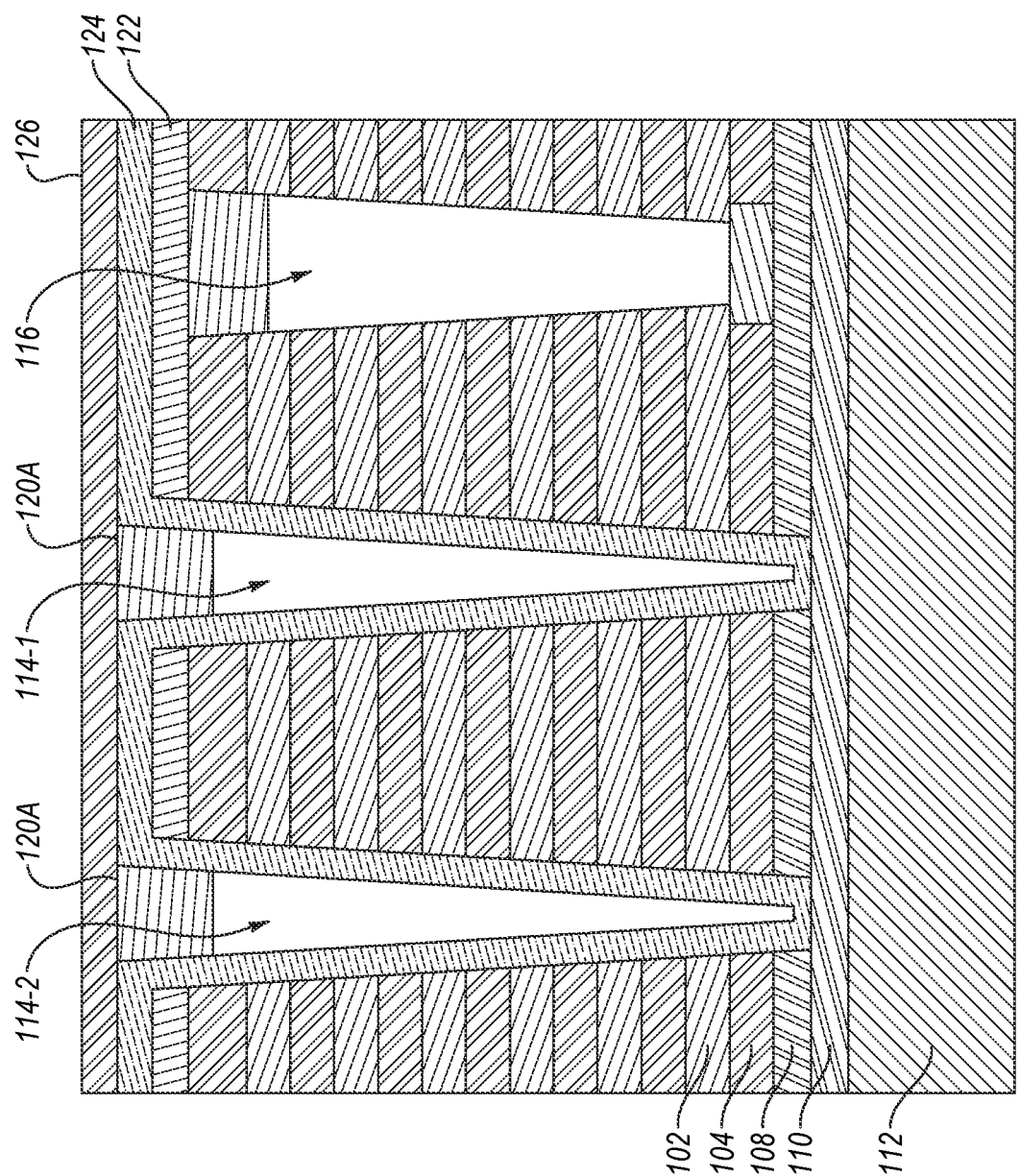

In FIG. 1E, second sacrificial structures 120A are formed in the contact openings 114. The second sacrificial structures 120A may be formed by a non-conformal deposition process, as described above, and occupy at least a portion of the remaining volume of the contact openings 114. The second sacrificial structures 120A may partially or substantially completely fill the contact openings 114. The second sacrificial structures 120A may, for example, occupy an upper portion of the contact openings 114. The second sacrificial structures 120A may be formed of the same material or a different material than the material of the sacrificial structures 120 in the slit 116. Dimensions of the second sacrificial structures 120A may be smaller than dimensions of the sacrificial structures 120 since the liner 124 is present in the contact openings 114. The second sacrificial structures 120A may be configured as plugs. In some embodiments, the material of the second sacrificial structures 120A is silicon nitride (e.g., $SiN_y$), carbon doped SiN (e.g., C—SiN), aluminum oxide ($AlO_x$), and/or other suitable material. The material of the second sacrificial structures 120A may be selectively removable later on by a subsequent removal process.

A cap material 126 is then formed adjacent to (e.g., on) the second sacrificial structures 120A and the liner 124. The cap material 126 may be, e.g., one or more of $SiO_x$, phosphosilicate glass (PSG), borosilicate glass (BSG), borophosphosilicate glass (BPSG), fluorosilicate glass (FSG), $AlO_x$, $HfO_x$, $NbO_x$, $TiO_x$, $ZrO_x$, $TaO_x$, and $MgO_x$. In some embodiments, the cap material 126 is a silicon oxide (e.g., $SiO_2$). The cap material 126 may be formed by conventional techniques. The cap material 126 may be formed at a thickness sufficient to cover the second sacrificial structures 120A and the liner 124, such as from about 1 nm to about 20 nm in thickness.

Figure 1F:
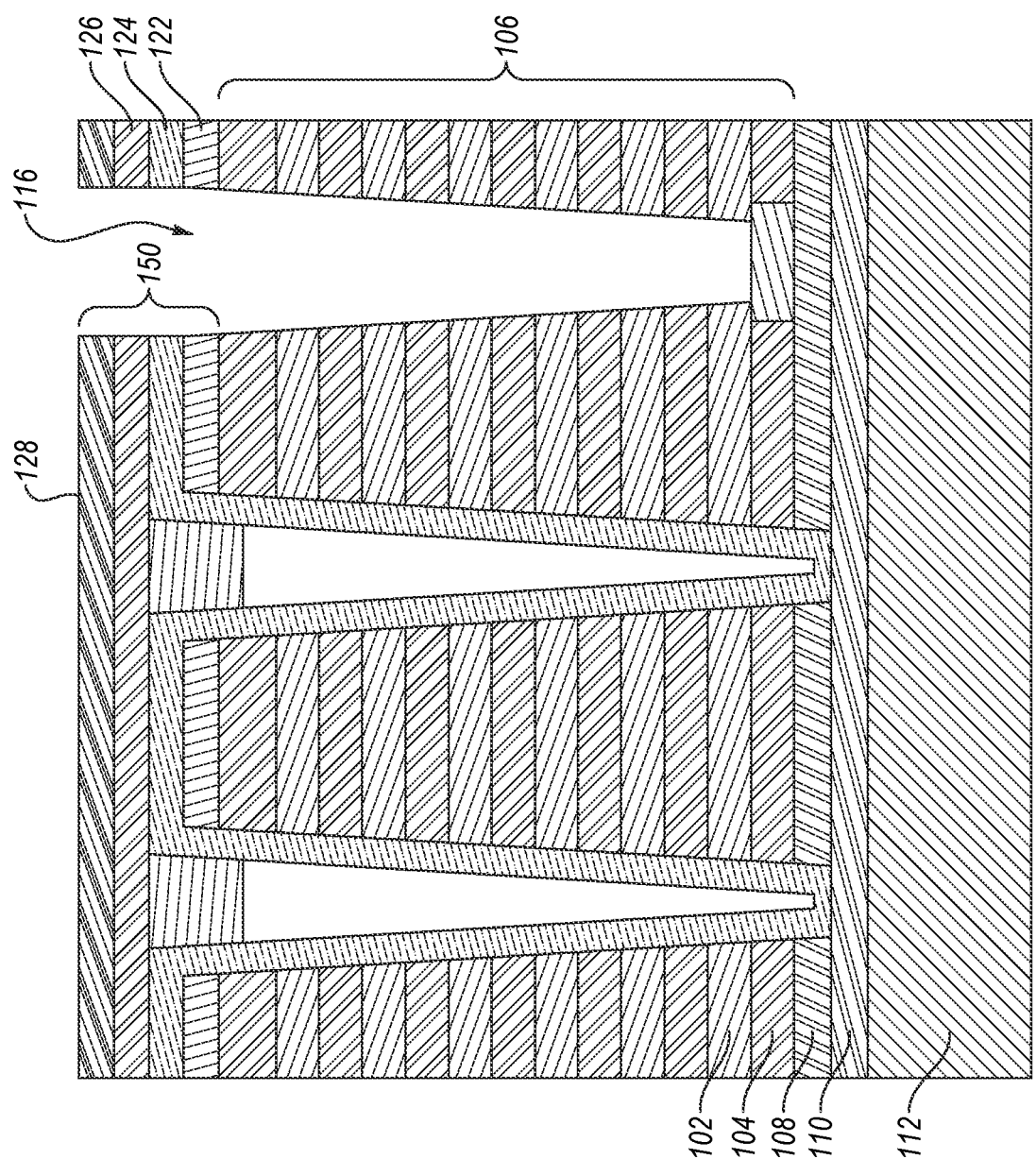

As shown in FIG. 1F, a mask material is formed adjacent to (e.g., on) the cap material 126 and patterned to form patterned mask 128. The patterned mask 128 may include openings adjacent to (e.g., over) the slit 116. The mask material may be formed and patterned by conventional techniques. The mask material may be a photoresist material or another dielectric material. The patterned mask 128, in combination with the cap material 126, the liner 124, and the patterned mask 122, may function as a dielectric cap 150 over the stack structure 106. The dielectric cap 150 may include multiple dielectric materials. In some examples, the dielectric cap 150 includes three, four, or five materials. The dielectric cap 150 may include a patterned photoresist, an oxide, an oxide of the liner 124, and a second photoresist. The patterned mask 128 and the cap material 126 may overlie the second sacrificial structures 120A. The materials of the dielectric cap 150 located over the slit 116 may then be removed to expose the sacrificial structure 120 in the slit 116. In some embodiments, the materials over the slit 116 are removed using a wet etch process. In other embodiments, the materials over the slit 116 are removed using a dry etch process. The sacrificial structure 120 may then be substantially removed from the slit 116. The sacrificial structure 120 may be removed by conducting a separate etch process or by using the same etch process used to remove the materials of the dielectric cap 150. Removal of the sacrificial structure 120 in the slit 116 exposes sidewalls of the stack structure 106 and an upper surface of the conductive plug 118.

Figure 1G:
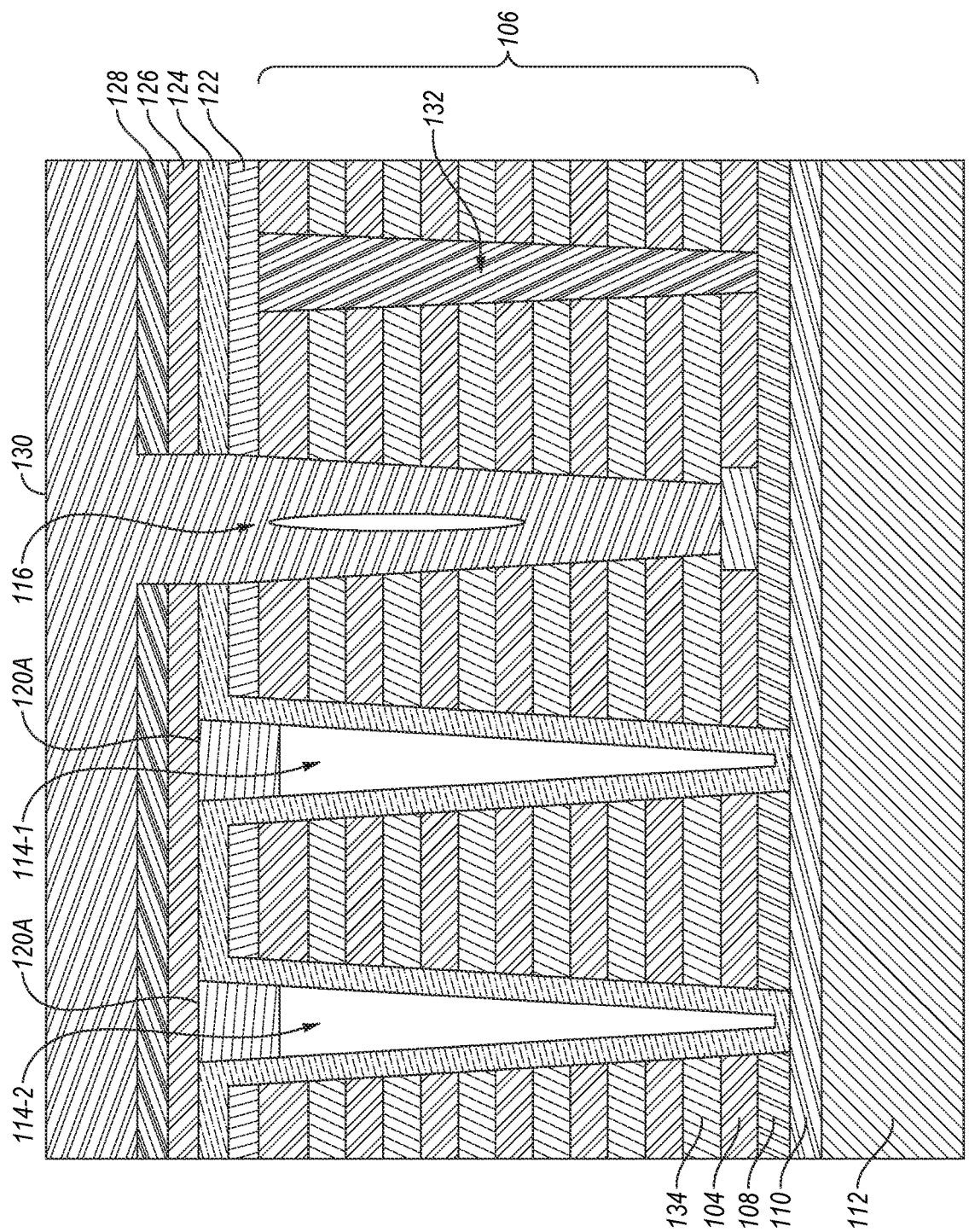

FIG. 1G shows the microelectronic device 100 after the replacement gate process has been performed. In the replacement gate process, alternating materials 102 are selectively removed from the stack structure 106 through the slit 116 and replaced with conductive materials 134. For example, the stack structure 106 may contain alternating nitride materials 102, which are exposed to an etchant to remove the alternating nitride materials 102 without substantially removing the alternating dielectric materials 104. The etchant may, for example, be a phosphoric acid etch. Openings (not shown) formed by the removal of the alternating nitride materials 102 are then filled with the conductive materials 134. The conductive materials 134 may, for example, be tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive material 134 includes tungsten. In other embodiments, the conductive material 134 is elemental tungsten. The liner 124 and the second sacrificial structures 120A in the contact openings 114 help to stabilize (e.g., support) the stack structure 106 during the replacement gate process.

A dielectric material 130 may then be formed in the slit 116, substantially completely filling the slit 116. The dielectric material 130 may also be formed adjacent to (e.g., over) the patterned mask 128. The dielectric material 130 may be any suitable dielectric material, for example, e.g., one or more of $SiO_x$, phosphosilicate glass (PSG), borosilicate glass (BSG), borophosphosilicate glass (BPSG), fluorosilicate glass (FSG), $AlO_x$, $HfO_x$, $NbO_x$, $TiO_x$, $ZrO_x$, $TaO_x$, and $MgO_x$, at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the dielectric material 130 includes silicon oxide, e.g., $SiO_2$.

Also shown in FIG. 1G are pillars 132 (e.g., memory pillars) that include cell films and memory cells. The pillars 132 extend through the stack structure 106 and contact the conductive material 108. The pillars 132 are formed by conventional techniques. While not shown in earlier drawings for simplicity and convenience, the pillars 132 are present laterally adjacent to the contact openings 114 and the slit 116 in the stack structure 106. The pillars 132 are electrically connected to conductive material 108 and to a conductive material 136 (see FIG. 1I) in the active first contact openings 114-1.

Figure 1H:
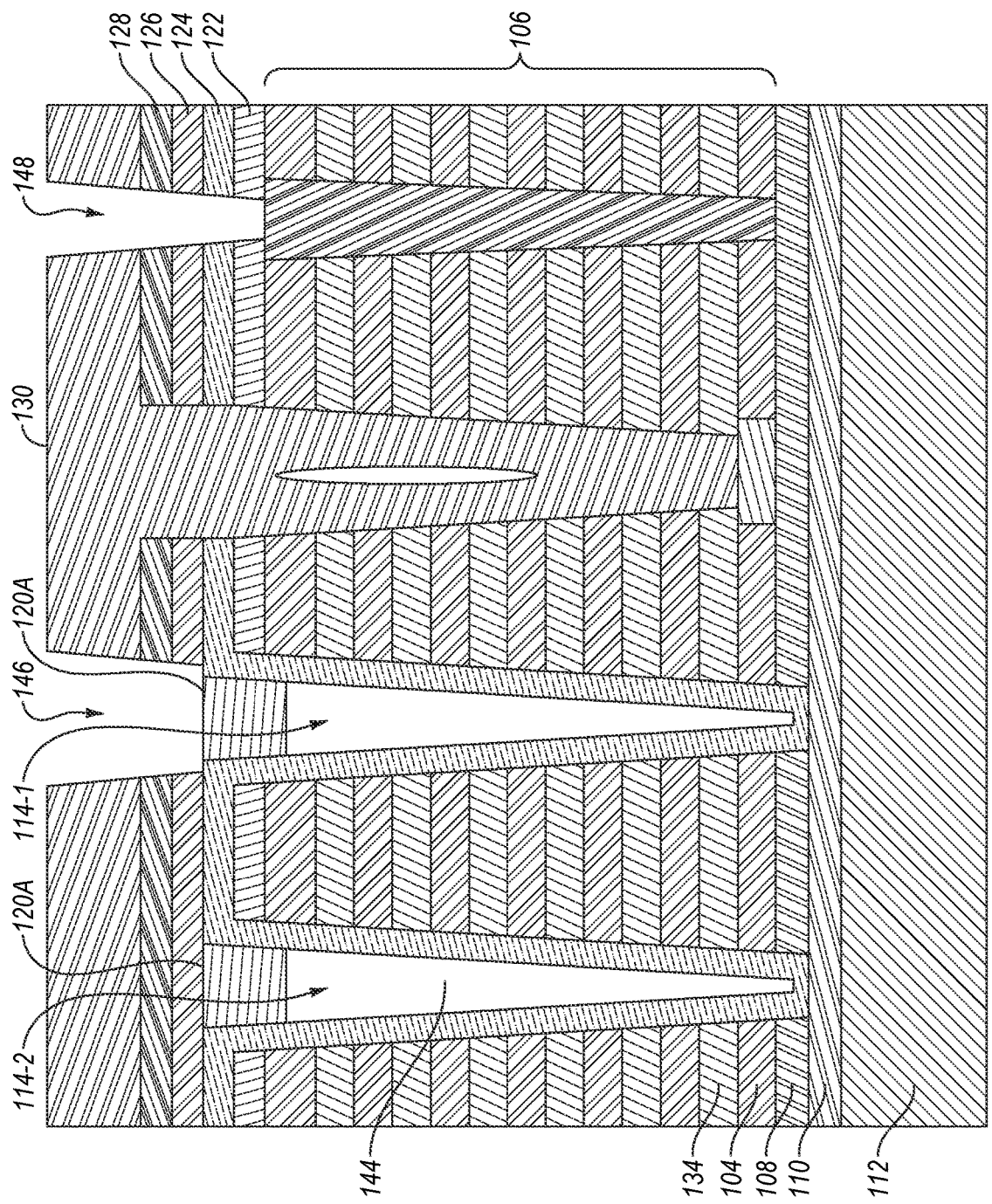

As shown in FIG. 1H, openings 146, 148 are formed through the dielectric material 130, the patterned mask 128, the cap material 126, the liner 124, and the patterned mask 122 to expose the second sacrificial structures 120A in the active first contact openings 114-1 and an upper surface of the pillars 132. Portions of the dielectric material 130, the patterned mask 128, the cap material 126, the liner 124, and the patterned mask 122 are removed by conventional techniques to form the openings 146, 148. The materials may be removed by an etch process, e.g., a dry etch process. The openings 146 may be formed over the second sacrificial structures 120A and the openings 148 may be formed over the pillars 132. A width of the openings 146 may be greater than a width of the openings 148 over the pillars 132, while a length of the openings 146 may be less than a length of the openings 148 over the pillars 132. Next, the exposed second sacrificial structures 120A are removed from some of the contact openings 114, e.g., from the active first contact openings 114-1. Since the second sacrificial structures 120A in the second contact openings 114-2 are protected by the dielectric material 130, the patterned mask 128, and the cap material 126, the second sacrificial structures 120A remain in the second contact openings 114-2.

Figure 1I:
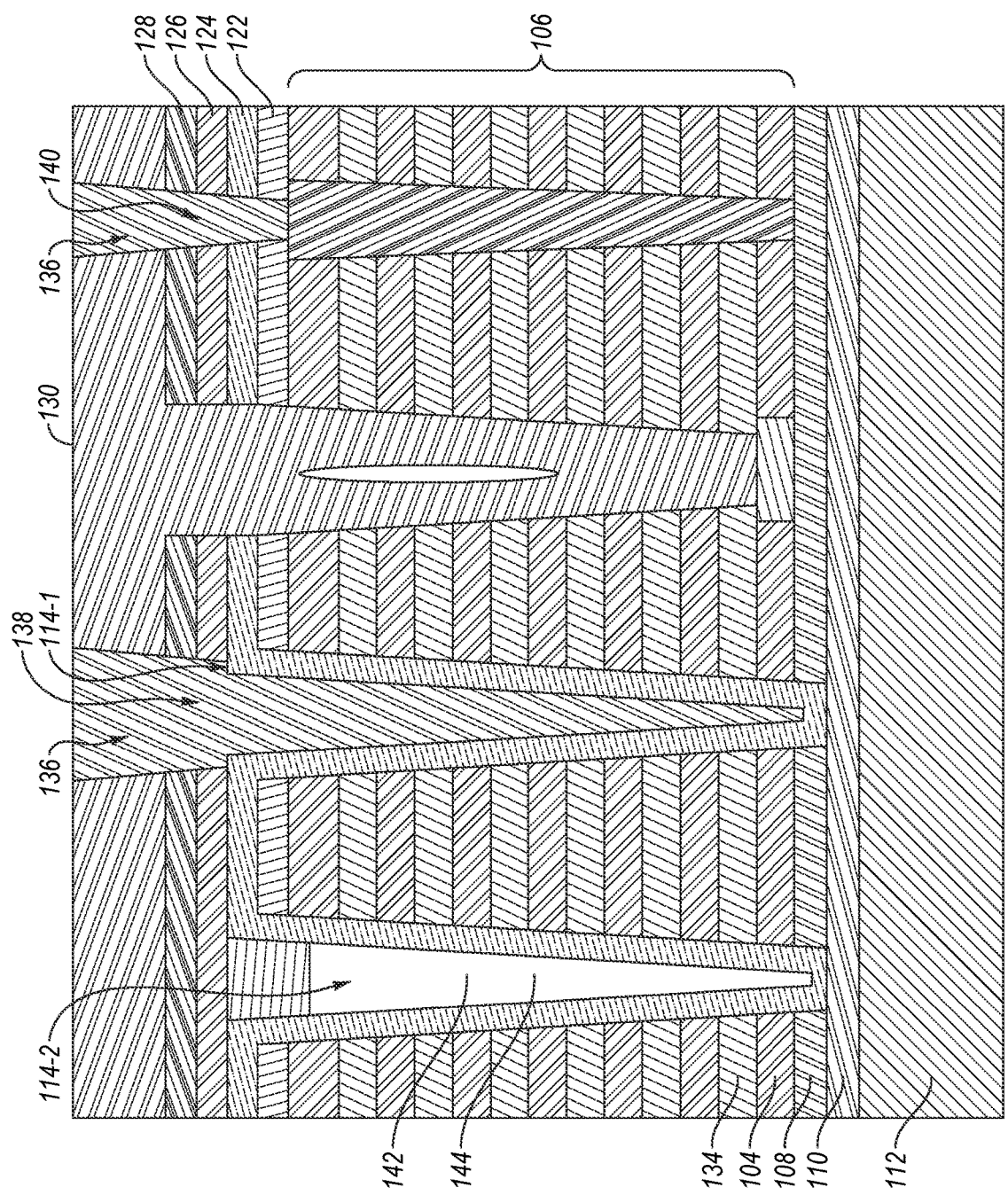

A conductive material 136 is formed in the active first contact openings 114-1 and the openings 146, as shown in FIG. 1I, forming the active contacts 138. The active contacts 138, therefore, extend from an upper surface of the dielectric material 130 and into the conductive material 108. The conductive material 136 is also formed in the openings 148, above the pillars 132, forming pillar contacts 140 that extend from the upper surface of the dielectric material 130 to the pillars 132. The conductive material 136 may be formed in the openings 114-1, 146, 148 at substantially the same time.

By forming the conductive material 136 in both of these openings 114-1, 146 in a single act, the formation of an interface between the two conductive material portions is prevented. Therefore, no interface is formed between the conductive material portions of the active contacts 138. The conductive material 136 laterally adjacent to the stack structure 106 and the conductive material 136 laterally adjacent to the dielectric material 130, the patterned mask 128, and the cap material 126 lack an interface. In addition, forming the conductive material 136 in the openings 146 and the openings 148 in the same operation improves alignment between the portions of the conductive material 136.

The conductive material 136 formed in the openings 114-1, 146, 148 may be any conductive material including, but not limited to, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive material 136 is tungsten.

In contrast, techniques of forming active contacts of conventional microelectronic device include forming a conductive material laterally adjacent to the stack structure and subsequently forming additional contacts (e.g., additional conductive material) over the active contacts. Since multiple process acts are utilized in the conventional process, precise alignment between the vertically adjacent portions of the conductive materials is difficult to achieve. However, forming the conductive material 136 portions according to embodiments of the disclosure ensures proper alignment between the vertically adjacent portions of the conductive material 136 to form the active contacts 138 by forming the conductive material 136 in the openings 114-1, 146 after conducting the replacement gate process.

Since the second contact openings 114-2 are protected by the dielectric material 130, the patterned mask 128, the cap material 126, and the second sacrificial structures 120A, no conductive material 136 is formed in the second contact openings 114-2. Instead, the second contact openings 114-2 remain partially filled by the liner 124 and the second sacrificial structures 120A. The second sacrificial structures 120A and the liner 124 define voids 144 in the second contact openings 114-2, forming support contacts 142. The voids 144 may include air or other gas. Alternatively, another dielectric material (not shown), such as $SiO_2$, may be formed in the voids 144, such as after conducting the replacement gate process. The liner 124 and the second sacrificial structures 120A of the support contacts 142 provide mechanical support to the microelectronic device 100. It was unexpected and surprising that the liner 124 in the second contact openings 114-2 was sufficient to support the stack structure 106 during processing, including during the replacement gate process, and that no additional conductive or dielectric material was needed in the second contact openings 114-2. The active contacts 138 and support contacts 142 are laterally adjacent to one another in the stack structure 106, and are laterally adjacent to the pillars 132 in the stack structure 106. The support contacts 142 include the liner 124, which is formed prior to the replacement gate process, while the active contacts 138 are formed after the replacement gate process.

By forming the liner 124 in the contact openings 114-1, 114-2 and subsequently forming the conductive material 136 only in the first contact openings 114-1 after conducting the replacement gate process, the microelectronic device 100 including the active contacts 138 and the support contacts 142 may be formed by a process that is easily integrated with current process flows.

In contrast to embodiments of the present disclosure, conventional techniques of forming active contacts from conductive material in all of the contact openings, substantially filling the contact openings. The additional conductive material present in the contact openings undesirably increases block bending stress and pillar bending stress within a conventional microelectronic device. The stress induced by the additional conductive material may cause bending of the stack structure in the conventional microelectronic device. By including the conductive material 136 in only the first contact openings 114-1 according to embodiments of the disclosure, without including the conductive material 136 in the second contact openings 114-2, stress within the microelectronic device 100 may be reduced since the volume of conductive material 136 is substantially lower. The microelectronic device 100 may also include a relatively greater number of the support contacts 142 (e.g., the second contact openings 114-2 lacking the conductive material) than the active contacts 138 (e.g., the first contact openings 114-1 including the conductive material 136). By reducing the number of contact openings 114 within which the conductive material 136 is formed to only the first contact openings 114-1, the stress within the microelectronic device 100 is reduced compared to a conventional microelectronic device.

Accordingly, in at least some embodiments, a microelectronic device, comprising: a stack structure comprising alternating conductive structures and dielectric structures; memory pillars extending through the stack structure; and contacts laterally adjacent to the memory pillars and extending through the stack structure. The contacts comprising active contacts and support contacts. The active contacts comprising a liner and a conductive material and the support contacts comprising the liner and a dielectric material. The conductive material of the active contacts being in electrical communication with the memory pillars.

Accordingly, in some embodiments, microelectronic device, comprising: a stack structure comprising alternating conductive materials and dielectric materials; a dielectric cap on top of the stack structure, the dielectric cap comprising two or more dielectric materials; first contacts extending through the dielectric cap and the stack structure. The first contacts comprising a conductive material and a liner, wherein the conductive material lacks an interface between a portion of the conductive material adjacent to the stack structure and a portion of the conductive material adjacent to the dielectric cap. The second contacts extending through only the stack structure. The second contacts comprising the liner and lacking a conductive material.

Accordingly, in some embodiments, a method of forming a microelectronic device, the method comprising: forming contact openings extending through a stack of alternating dielectric materials and nitride materials. The contact openings comprising first contact openings and second contact openings. The method including forming a slit in the stack, the slit laterally adjacent to the first contact openings and the second contact openings. The method including forming a first sacrificial structure in the slit; forming a liner in the first contact openings and in the second contact openings; and forming second sacrificial structures in the first contact openings and in the second contact openings. The method including forming a cap over the stack and over the first and second sacrificial structures; and removing a portion of the cap over the first sacrificial structures; removing the first sacrificial structure from the slit. The method including removing the nitride materials of the stack through the slit to form openings between the dielectric materials of the stack; forming a conductive material in the openings of the stack; forming a dielectric material in the slit and over the second sacrificial structures; and removing a portion of the dielectric material and the cap to form cap openings above the second sacrificial structures in the first contact openings and above memory pillars extending through the stack. The method including removing the second sacrificial structures from the first contact openings; and forming a conductive material in the first contact openings and in the cap openings to form active contacts extending through the stack.

Figure 2:
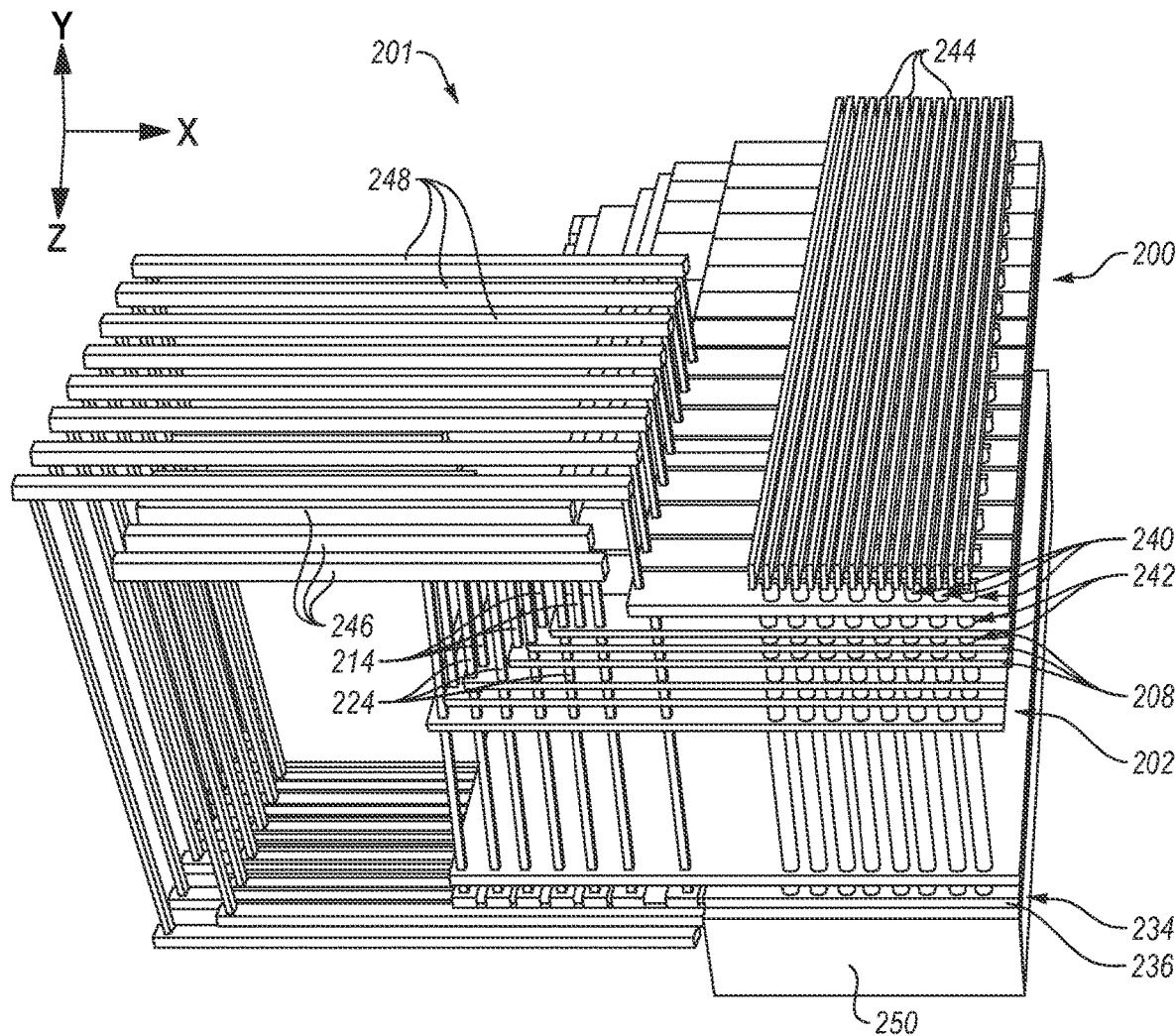
FIG. 2 is a partial, cutaway, perspective, schematic illustration of an apparatus including one or more microelectronic devices in accordance with embodiments of the disclosure.

FIG. 2 illustrates a partial cutaway perspective view of a portion of an apparatus 201 (e.g., a memory device, such as a dual deck 3D NAND Flash memory device) including one or more microelectronic devices 200. The microelectronic device 200 may be substantially similar to the microelectronic device 100 previously described with reference to FIGS. 1A through 1I. The microelectronic device 100 may include the active contacts 138 and the support contacts 142, with no interface between the conductive material 136 portions in the first contact openings 114-1.

The apparatus 201 further includes a source tier 234 underlying the stack structure 202. The source tier 234 includes a source structure 236 (e.g., a source plate). The source structure 236 may underlie the stack structure 202.

The source structure 236 may be formed of and include at least one electrically conductive material, such as one or more of a metal (e.g., W, Ti, Mo, Nb, V, Hf, Ta, Cr, Zr, Fe, Ru, Os, Co, Rh, Ir, Ni Pd, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). For example, the source structure 236 may be formed by patterning (e.g., using a predetermined reticle configuration) the electrically conductive material.

The source tier 234 may be located vertically below (e.g., in the Z-direction) and in physical contact with the support structures 224 of the microelectronic device 200.

As shown in FIG. 2, the apparatus 201 may further include strings 240 of memory cells 242 vertically coupled to each other in series, data lines 244 (e.g., bit lines), access lines 246, and select lines 248. The strings 240 of the memory cells 242 extend vertically and orthogonal to conductive lines and tiers (e.g., the data lines 244, the source tier 234, the tiers 208 of the stack structure 202, the access lines 246, the select lines 248) of the apparatus 201, and the contact structures 214 may electrically couple components to each other as shown (e.g., the access lines 246 and the select lines 248 to the tiers 208 of the stack structure 202 of the microelectronic device 200).

With continued reference to FIG. 2, the apparatus 201 may also include a control unit 250 (e.g., a control device) positioned vertically below the strings 240 of memory cells 242, which may include one or more of string driver circuitry, pass gates, circuitry for selecting gates, circuitry for selecting conductive lines (e.g., the data lines 244, the access lines 246, the select lines 248, additional data lines, additional access lines, additional select lines), circuitry for amplifying signals, and circuitry for sensing signals. In some embodiments, the control unit 250 is at least partially (e.g., substantially) positioned within horizontal boundaries (e.g., in the X-direction and the Y-direction) of a horizontal area occupied by the strings 240 of memory cells 242. The control unit 250 may, for example, be electrically coupled to the data lines 244, the source structure 236 of the source tier 234, the access lines 246, and the select lines 248. In some embodiments, the control unit 250 includes CMOS (complementary metal-oxide-semiconductor) circuitry. In such embodiments, the control unit 250 may be characterized as having a "CMOS under Array" ("CuA") configuration.

Microelectronic devices (e.g., the microelectronic device 100 previously described with reference to FIGS. 1A through 1I) and apparatus (e.g., the apparatus 201 previously described with reference to FIG. 2) in accordance with embodiments of the disclosure may be used in embodiments of electronic systems of the disclosure. For example, FIG. 3 is a block diagram of an illustrative electronic system 300 according to embodiments of the disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of a microelectronic device 100 and an apparatus (e.g., the apparatus 201 previously described with reference to FIG. 2) previously described herein. The electronic system 300 may further include at least one electronic signal processor device 304 (often referred to as a "microprocessor"). The electronic signal processor device 304 may, optionally, include an embodiment of one or more of a microelectronic devices (e.g., the microelectronic devices 100 previously described with reference to FIGS. 1A through 1I) and a microelectronic device (e.g., the apparatus 201 previously described with reference to FIG. 2). While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure (e.g., a microelectronic device 100 previously described with reference to FIGS. 1A through 1I) and a microelectronic device (e.g., the apparatus 201 previously described with reference to FIG. 2) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, one or more of a monitor, a display, a printer, an audio output jack, and a speaker. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Accordingly, in at least some embodiments, an electronic system comprising: an input device; an output device; a processor operatively coupled to the input device and the output device; and a memory device operatively coupled to the processor. The memory device comprises: a stack of alternating dielectric materials and conductive materials; a dielectric cap on top of the stack, the dielectric cap comprising one or more dielectric materials; contact openings extending through the stack and the dielectric cap; a conductive material and a liner in a first portion of the contact openings. The conductive material extending from an upper surface of the dielectric cap to a lower surface of the stack and lacking an interface between a portion of the conductive material adjacent to the stack and a portion of the conductive material adjacent to the dielectric cap. The liner in a second portion of the contact openings.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
a stack structure comprising alternating conductive structures and dielectric structures;
memory pillars extending through the stack structure; and
contacts laterally adjacent to the memory pillars and extending through the stack structure, the contacts comprising active contacts and support contacts, the active contacts comprising a liner and a conductive material and the support contacts comprising the liner and a dielectric material, the conductive material of the active contacts being in electrical communication with the memory pillars.

2. The microelectronic device of claim 1, wherein the microelectronic device comprises a greater number of support contacts than active contacts.

3. The microelectronic device of claim 1, further comprising a cap of dielectric materials on top of the stack structure.

4. The microelectronic device of claim 1, wherein the conductive material of the active contacts extends through the stack structure and above the stack structure.

5. The microelectronic device of claim 1, wherein the dielectric material of the support contacts comprises a gas.

6. The microelectronic device of claim 1, wherein the support contacts lack the conductive material.

7. The microelectronic device of claim 1, further comprising contacts above the memory pillars.

8. The microelectronic device of claim 7, wherein a conductive material of the contacts above the memory pillars is a same material as the conductive material of the active contacts.

9. A microelectronic device, comprising:
a stack structure comprising alternating conductive materials and dielectric materials;
a dielectric cap on top of the stack structure, the dielectric cap comprising two or more dielectric materials;
first contacts extending through the dielectric cap and the stack structure, the first contacts comprising a conductive material and a liner, wherein the conductive material comprises a continuous structure and lacks an interface between a portion of the conductive material adjacent to the stack structure and a portion of the conductive material adjacent to the dielectric cap; and
second contacts extending through only the stack structure, the second contacts comprising the liner and lacking a conductive material.

10. The microelectronic device of claim 9, wherein the first contacts are laterally adjacent to the second contacts.

11. The microelectronic device of claim 9, wherein the first contacts and the second contacts are laterally adjacent to the stack structure.

12. The microelectronic device of claim 9, wherein the second contacts each comprise a void adjacent to the liner.

13. The microelectronic device of claim 9, wherein the liner of the second contacts is on opposing sidewalls of the stack structure and a dielectric material is between opposing sidewalls of the liner.

14. The microelectronic device of claim 9, wherein an upper portion of the first contacts exhibits a greater width than a lower portion of the first contacts.

15. A method of forming a microelectronic device, the method comprising:

forming contact openings extending through a stack of alternating dielectric materials and nitride materials, the contact openings comprising first contact openings and second contact openings;

forming a slit in the stack, the slit laterally adjacent to the first contact openings and the second contact openings;

forming a first sacrificial structure in the slit;

forming a liner in the first contact openings and in the second contact openings;

forming second sacrificial structures in the first contact openings and in the second contact openings;

forming a cap over the stack and over the first and second sacrificial structures;

removing a portion of the cap over the first sacrificial structure;

removing the first sacrificial structure from the slit;

removing the nitride materials of the stack through the slit to form openings between the alternating dielectric materials of the stack;

forming a conductive material in the openings between the alternating dielectric materials of the stack to form a stack structure comprising alternating conductive structures and dielectric structures;

forming a dielectric material in the slit and over the second sacrificial structures;

removing a portion of the dielectric material and the cap to form cap openings above the second sacrificial structures in the first contact openings and above memory pillars extending through the stack structure;

removing the second sacrificial structures from the first contact openings; and forming another conductive material in the first contact openings and in the cap openings to form contacts laterally adjacent to the memory pillars and extending through the stack structure, the contacts comprising active contacts and support contacts, the active contacts comprising the liner and the another conductive material and the support contacts comprising the liner and another dielectric material, the conductive material of the active contacts being in electrical communication with the memory pillars.

16. The method of claim 15, wherein forming a first sacrificial structure in the slit comprises sub-conformally forming the first sacrificial structure in the slit.

17. The method of claim 15, wherein removing the second sacrificial structures from the first contact openings comprises removing the second sacrificial structures from the first contact openings without removing the second sacrificial structures from the second contact openings.

18. The method of claim 15, wherein forming a conductive material in the first contact openings and in the cap openings comprises forming the contacts above the memory pillars.

19. The method of claim 15, wherein forming a conductive material in the first contact openings and in the cap openings comprises forming the active contacts extending through the cap and the stack in a single operation.

20. The method of claim 15, wherein forming a cap over the stack and over the first and second sacrificial structures comprises forming the cap comprising one or more of a first photoresist material, an oxide material, and a second photoresist material, and wherein forming a dielectric material in the slit and over the second sacrificial structures comprises forming the dielectric material over the cap.

21. The method of claim 15, wherein removing a portion of the dielectric material and the cap comprises exposing the second sacrificial structures in the first contact openings and the memory pillars.

22. The method of claim 21, wherein forming another conductive material in the first contact openings and in the cap openings to form active contacts extending through the stack comprises forming the another conductive material in the first contact openings and in the cap openings substantially simultaneously.

23. The method of claim 21, wherein forming another conductive material in the first contact openings and in the cap openings to form active contacts extending through the stack comprises forming a portion of the another conductive material laterally adjacent to the stack and a portion of the another conductive material laterally adjacent to the cap, the portions of the another conductive material lacking an interface therebetween.

24. An electronic system comprising:
an input device;
an output device;
a processor operatively coupled to the input device and the output device; and
a memory device operatively coupled to the processor, wherein the memory device comprises:
a stack of alternating dielectric materials and conductive materials;
a dielectric cap on top of the stack, the dielectric cap comprising one or more dielectric materials;
contact openings extending through the stack and the dielectric cap;
a conductive material and a liner in a first portion of the contact openings, the conductive material extending continuously from an upper surface of the dielectric cap to a lower surface of the stack and lacking an interface between a portion of the conductive material adjacent to the stack and a portion of the conductive material adjacent to the dielectric cap; and
the liner in a second portion of the contact openings.

25. The electronic system of claim 24, wherein the second portion of the contact openings comprises a void adjacent to the liner.

* * * * *